United States Patent
Baum et al.

[11] Patent Number: 6,159,641
[45] Date of Patent: *Dec. 12, 2000

[54] METHOD FOR THE REPAIR OF DEFECTS IN LITHOGRAPHIC MASKS

[75] Inventors: Thomas Hall Baum, San Jose; Paul Brian Comita, Menlo Park; Franklin Mark Schellenberg, Cupertino, all of Calif.

[73] Assignee: International Business Machines Corporation, Armonk, N.Y.

[*] Notice: This patent is subject to a terminal disclaimer.

[21] Appl. No.: 08/168,569

[22] Filed: Dec. 16, 1993

[51] Int. Cl.⁷ .................................................. G03F 9/00
[52] U.S. Cl. .................................................. 430/5
[58] Field of Search .................... 430/5, 321; 427/140, 427/524

[56] References Cited

U.S. PATENT DOCUMENTS

| | | | |
|---|---|---|---|
| 4,164,788 | 8/1979 | Jain | 364/515 |
| 4,451,503 | 5/1984 | Blum et al. | 427/53.1 |
| 4,489,102 | 12/1984 | Olmer et al. | 427/54.1 |
| 4,543,270 | 9/1985 | Oprysko et al. | 427/53.1 |
| 4,609,566 | 9/1986 | Hongo et al. | 427/53.1 |
| 4,668,528 | 5/1987 | Ehrlich et al. | 427/53.1 |
| 4,698,236 | 10/1987 | Kellogg et al. | 430/5 |
| 4,711,790 | 12/1987 | Morishige | 427/10 |
| 4,727,234 | 2/1988 | Oprysko et al. | 219/121 L |
| 4,778,693 | 10/1988 | Drozdowicz et al. | 427/53.1 |
| 4,901,668 | 2/1990 | Murakami | 118/722 |
| 4,902,899 | 2/1990 | Lin et al. | 250/492.1 |
| 5,045,417 | 9/1991 | Okamoto | 430/5 |
| 5,085,957 | 2/1992 | Hosono | 430/5 |
| 5,091,979 | 2/1992 | White | 385/1 |
| 5,273,849 | 12/1993 | Harriott et al. | 430/5 |

OTHER PUBLICATIONS

Baum et al., "Radiation–Induced Repair of Clear Defects in Masks", Research Disclosure, Feb. 1987, No. 274, Kenneth Mason Publications Ltd, England.

Toh, et al., "Chromeless Phase–Shifted Masks: A New Approach to Phase–Shifting Masks", A Preprint from the Tenth Annual Symposium on Microlithography of BACUS, Sep., 1990.

Watanabe et al., "Pattern Transfer Characteristics of Transparent Phase Shifting Mask", Japanese Journal of Applied Physics, vol. 30, No. 11B, Nov., 1991, pp. 3004–3009.

Levenson, "What IS a Phase–Shifting Mask", IBM Research Division, K32/802D, 605 Harry Road, San Jose, CA 95120.

Watanabe et al., "Transparent Phase Shifting Mask", Kyoto Research Laboratory, Matsushita Electronics Corporation 19, Nishikujo–Sasugach, Minami–ku, Kyoto 601 Japan. 1990 IEEE.

Baum et al, "Projection Printing of God Micropatterns by Photochemical Decomposition", Appl. Phys. Lett. 49 (18), Nov. 3, 1986.

"Fabrication of Grooved Glass Substrates by Phase Mask Lithography", Disclosed anonymously, Research Disclosure, Jan. 1991, No. 321, Kenneth Mason Publications Ltd, England.

*Primary Examiner*—S. Rosasco
*Attorney, Agent, or Firm*—Robert B. Martin

[57] ABSTRACT

The present invention relates to a method for the repair of defects in the nonprinting region of a phase-shifting optical lithography mask by depositing an opaque material on the defect from a gaseous precursor by beam-induced deposition.

9 Claims, 1 Drawing Sheet

METHOD FOR THE REPAIR OF DEFECTS IN LITHOGRAPHIC MASKS

FIELD OF THE INVENTION

The present invention relates to a method for the repair of phase-shifting defects in an optical lithographic phase shifting mask.

BACKGROUND OF THE INVENTION

Optical projection exposure tools are now widely used in optical lithography in the production of integrated circuits. The exposure tools generally comprise an electromagnetic light source, a mask and a lens. The tool projects the image of the mask onto the surface of a photoresist film disposed on a wafer. Because of the continuing demands for higher circuit density in integrated circuits, there is a continuing desire to improve the resolution of optical lithography. One method of improving the resolution involves the use of phase-shifting masks. The phase-shifting mask generally comprises a plurality of individual transmissive phase-shifting layers disposed in a pattern on a transmissive substrate. Optionally, the phase-shifting mask can also be provided with an opaque chrome pattern. The phase-shifting layer causes the transmitted light to be out of phase (phase shifted) with respect to the light which is only transmitted through the substrate, i.e. the reference light, resulting in coherent interaction of the phase-shifted and reference transmitted light. Depending on the pattern of the phase shifting layers, the coherent interaction of the transmitted phase-shifted and reference light can be (i) completely destructive interference which prevents light from reaching the surface of the photoresist film or (ii) a combination of constructive and destructive interference which improves the resolution of the light which reaches the surface of the photoresist film. Phase-shifting masks are generally fabricated using standard photolithography techniques. For example, Levenson et al., in his article "Improving Resolution in Photolithography with Phase-Shifting Mask" IEEE Transaction on Electron Devices Vol. 29, No. 12 (12/82), discloses fabrication of a phase-shifting mask using photolithography with polymethacrylate as the mask material. However, occasionally during the fabrication of the phase-shifting mask, defects, such as voids, occur in the mask. These defects disrupt the coherent interaction of the transmitted light. For regions of the mask designed (patterned) to prevent light from reaching the photoresist (nonprinting regions of the mask) the defects can result in leakage of light onto the surface of the photoresist film. Therefore, there is a need in the art for a method for repairing defects in the nonprinting regions of phase-shifting mask.

It is therefore an object of the present invention to provide a method for repairing defects in the nonprinting regions of phase-shifting masks.

Other objects and advantages will become apparent from the following disclosure.

SUMMARY OF THE INVENTION

The present invention relates to a method for repairing a defect in a nonprinting region of a phase-shifting mask comprising the step of depositing an opaque material from a gas on the defect by beam-induced deposition. Surprisingly the opaque material does not disrupt the coherent destructive interaction of the phase-shifted and reference light which is transmitted through the repaired region of the phase mask.

The present invention also relates to a lithographic mask which has been repaired using the method of the present invention.

A more thorough disclosure of the present invention is presented in the detailed description which follows and from the accompanying figures in which.

DETAILED DESCRIPTION OF THE INVENTION

The present invention relates to a method for repairing a phase-shifting defect in the nonprinting region of a phase-shifting mask comprising the step of depositing an opaque material on the defect by beam-induced decomposition of gaseous precursor.

Figure 1:
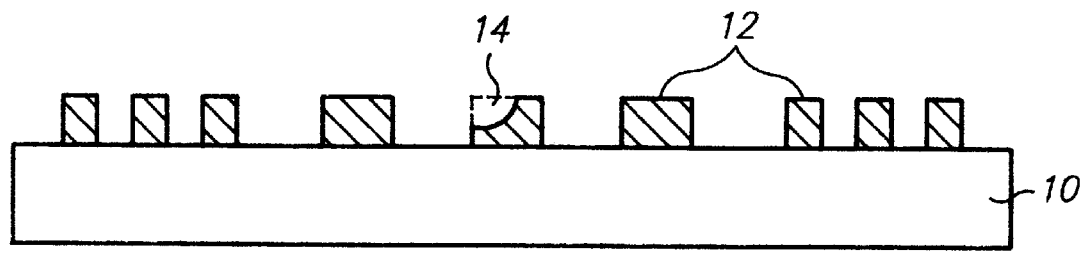
FIG. 1 is a cross-sectional view of the nonprinting region of a phase-shifting mask.

Referring to FIG. 1, there is shown a cross-sectional view of a nonprinting region of a completely transmissive (chromeless) portion of a phase-shifting mask comprising the transmissive substrate 10 and phase-shifting layers 12. The transmissive substrate comprises material such as quartz, pyrex or other transmissive material. The phase-shifting layers are conveniently disposed on the substrate.

In the nonprinting region of the transmissive phase mask, the phase-shifting layers 12 are disposed on the substrate 10 in a predetermined pattern to cause coherent destructive interaction of the transmitted phase-shifted and reference light, thereby preventing the light from reaching the surface of the photoresist film. Such patterns are known to those skilled in the art. Although the coherent interaction may not be completely destructive, the light fluence reaching the surface of the photoresist is diminished below the amount required to chemically activate the photoresist. The phase-shifting layers of the mask can be fabricated using photolithography techniques such as those disclosed in Brock et al., "Fabrication of grooved glass substrates by phase mask lithography," J. Vac. Sci. Technol. B9, 3155 (1991), the disclosure of which is incorporated herein by reference. The desired thickness (d) of a 180° phase-shifting layer can be calculated according to the formula $$d=\tau/2(n-1)$$

where n is the index of refraction of the phase-shifting layer and $\tau$ is the wavelength of the transmitted light. It is generally desired to have the index of refraction of the material comprising the phase-shifting layer matching or close to the index of refraction of the substrate.

In FIG. 1 there is shown a void-type defect 14 in one of the phase-shifting layers in the nonprinting region of the phase-shifting mask. The void-type phase-shifting defect 14 in the mask causes inadequate phase-shifting of the light transmitted through that portion of the phase-shifting layer which disrupts the destructive coherent interaction of the transmitted light and results in leakage of light onto the surface of the photoresist to chemically activate the photoresist and print a pattern in the developed photoresist.

Figure 2:
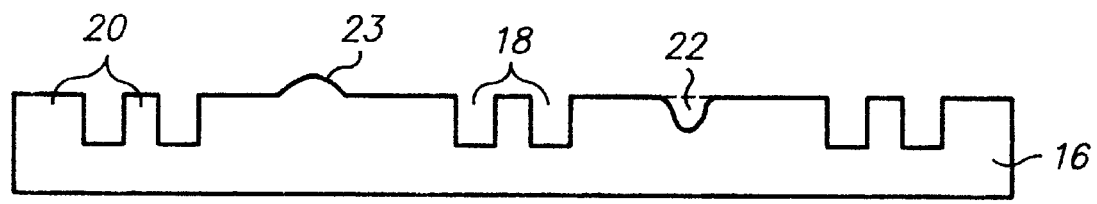
FIG. 2 is a cross-sectional view of the nonprinting region of an alternative embodiment of a phase-shifting mask.

Referring to FIG. 2, there is shown an alternative embodiment of an nonprinting region of a phase-shifting mask comprising a substrate 16 having trenches 18 formed therein to form phase-shifting layers 20. The mask has a defects 22 and 23 in the mask which disrupt the destructive coherent interaction of the transmitted light and results in leakage of light onto the photoresist material.

In the method of the present invention, phase-shifting defects 14, 22 and 23 are repaired by depositing an opaque material on the defect using a beam-induced deposition process.

Suitable materials for use in the method of the present invention to repair defects include gaseous precursor materials which dissociate (decompose) upon exposure to an energized beam to form a solid opaque material deposited on the defect in the mask.

Suitable materials which deposit an opaque film include metal carbonyls, metal beta-diketonates, including alkyl and dialkyl metal beta-diketonates and metal haloacetylacetonates and metal alkyls (preferably lower alkyls $C_1$–$C_6$). Preferred metals for such materials are, aluminium, tin, lead, indium and transition metals.

Specific materials include hexacarbonyl molybdenum, hexacarbonyl tungsten, dimethyl gold trifluoroacetylacetonate, platinum tetrakis (trifluorophosphine) and diethyl zinc. Other suitable gaseous precursor materials will be known to those skilled in the art. The deposited material is substantially opaque at the wavelength of the light to be utilized in the optical lithography process to form the integrated circuit.

Suitable electromagnetic beams for inducing dissociation deposition of the opaque material are preferably ultraviolet and have a wavelength of about 150 nm to about 400 nm, preferably about 193 nm to about 365 nm and are generated by art known sources such as laser (e.g. excimer, or Nd YAG ×3 or helium-cadmium laser at 325 nm). The wavelength of the beam will depend on the nature of the gaseous precursor and desired resolution of the repair process. A preferred beam is a 248 nm beam generated from an KrF excimer laser. The beam may be pulsed or continuous. In order to insure the deposition of the correct amount of material onto the defect, deposition rate/time data with the beam and various gaseous precursors may be obtained prior to the repair process.

In the method of the present invention, the phase-shifting mask with the defect in the nonprinting region is placed in a chamber on an x-y translation stage. The chamber is provided with one or more quartz windows. The chamber is evacuated and then filled with the desired gaseous precursor material suitably at ambient pressure. The defect is conveniently located using the microscope preferably with visible illumination. The beam is then focused through optical lens on the defect to cause deposition of solid opaque material onto the defect. Using the previously obtained deposition rate data, the process is continued until the desired amount of opaque material is deposited onto the defect.

Surprisingly, the deposited opaque material does not unacceptably interfere with the destructive coherent interaction of the phase-shifted light and reference light transmitted through the nonprinting region the mask. The repaired nonprinting region permits sufficient destructive coherent interaction of transmitted light to prevent light activation of the photoresist.

The present invention also relates to a phase-shifting mask having a phase-shifting layer which has been repaired by beam induced deposition of opaque material on a phase-shifting defect. The repaired phase-shifting mask is useful in optical lithography for forming circuit patterns on integrated circuit chips.

The following examples are detailed descriptions of methods of the present invention. The detailed descriptions fall within the scope of, and serve to exemplify, the more generally described methods set forth above. The examples are presented for illustrative purposes only, and are not intended as a restriction on the scope of the invention.

EXAMPLE 1

The example demonstrates the repair of a completely transparent phase-shifting mask comprising a plurality of noncontigious circular cavities formed in a quartz substrate. This mask, with this pattern of circular cavities, does not print due to the destructive interference of the transmitted light. The mask had a defect which was an area of the mask which is missing two rows of cavities. The defective mask was printed onto a photoresist coated silicon wafer with Nikon i-line (365 nm) 5× reduction stepper. A photograph of the image of the developed photoresist pattern showed that the missing rows of cavities allow leakage of light onto the photoresist to expose the photoresist. The mask was then mounted as the window of a small vacuum chamber with the back side of the mask facing outward. The chamber was evacuated and filled with gold dimethyl-beta-trifluoroacetylacetonate at ambient pressure. The defect was irradiated with an excimer laser to a total dose of 50 mJ (100 $\mu$J/pulse, pulse width 15 n sec, 20 Hz repetition). A reflection micrograph of the repaired mask showed the area of the missing rows of the circular cavities covered with opaque material. A photograph of the developed photoresist image pattern using the repaired mask showed that there was no leakage of light onto the photoresist to expose the photoresist. The opaque repair of the defect surprisingly did not interfere with the destructive coherent interaction of the light transmitted through the nonprinting region of the mask.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

We claim:

1. A method for repairing a defect in the transmissive nonprinting region of a phase-shifting mask comprising the step of depositing an opaque material on the defect from a gaseous precursor by beam-induced deposition.

2. The method of claim 1 wherein said beam-induced deposition is with a laser beam having a wavelength of about 150 nm to about 400 nm.

3. The method of claim 2 wherein the precursor is selected from metal carbonyls, metal beta-diketonates, metal halo-acetylacetonates and metal alkyls.

4. A method for repairing a defect in the transmissive nonprinting region of a phase-shifting mask comprising the steps of:

(i) contacting the phase-shifting mask with a decomposable gaseous precursor, and (ii) focusing a beam on the defect to decompose the gaseous precursor and deposit opaque material on the defect.

5. The method of claim 4 wherein the beam is a laser beam having a wavelength of about 150 nm to about 400 nm.

6. The method of claim 5 wherein the precursor is selected from metal carbonyl, metal beta-diketonates, metal halo-acetylacetonates and metal alkyls.

7. A phase-shifting mask which has been repaired by depositing an opaque material on a defect in the transmissive nonprinting region of the mask from a gaseous precursor by beam-induced deposition.

8. The mask of claim 7 wherein said beam-induced deposition is with a laser beam having a wavelength of about 150 nm to about 400 nm.

9. The mask of claim 8 wherein the precursor is selected from metal carbonyl, metal beta-diketonates, metal halo-acetylacetonates and metal alkyls.

* * * * *